United States Patent [19]
Sachdev et al.

[11] Patent Number: 5,470,693
[45] Date of Patent: Nov. 28, 1995

[54] METHOD OF FORMING PATTERNED POLYIMIDE FILMS

[75] Inventors: Krishna G. Sachdev, Hopewell Junction; Joel R. Whitaker, Port Ewen; Umar M. Ahmad, Hopewell Junction, all of N.Y.

[73] Assignee: International Business Machines Corporation, Armonk, N.Y.

[21] Appl. No.: 837,505

[22] Filed: Feb. 18, 1992

[51] Int. Cl.$^6$ .................................. G03F 7/26
[52] U.S. Cl. .................. 430/315; 430/317; 430/324; 430/329; 430/330
[58] Field of Search .................. 430/311, 315, 430/317, 324, 327, 329, 330, 396

[56] References Cited

U.S. PATENT DOCUMENTS

| | | | |
|---|---|---|---|
| 4,353,778 | 10/1982 | Fineman | 430/316 |
| 4,411,735 | 10/1983 | Belani | 430/317 |
| 4,436,583 | 3/1984 | Saiki | 430/313 |
| 4,690,999 | 9/1987 | Numata et al. | 528/188 |
| 4,702,792 | 10/1987 | Chow | 430/314 |
| 4,869,777 | 9/1989 | Apschel et al. | 156/626 |
| 5,122,439 | 6/1992 | Miersch | 430/311 |
| 5,153,303 | 10/1992 | Jasne | 430/9 |

OTHER PUBLICATIONS

R. Rubner, A Photopolymer—The Direct Way to Polyimide Patterns, Photographic Science and Engineering, 1979, pp. 303–309.

*Primary Examiner*—Kathleen Duda
*Attorney, Agent, or Firm*—Whitham, Curtis, Whitham & McGinn; Aziz M. Ahsan

[57] ABSTRACT

A method of producing patterned polyimide films using wet development of polyimide precursors through a photoresist mask is disclosed. Low thermal coefficient of expansion (TCE) polyimide patterns are formed by starting with a polyamic acid precursor, typically, that derived from 3,3',4,4'-biphenyltetracarboxylic acid dianhydride-p-phenylenediamine (BPDA-PDA). Polyimide patterns are generated with complete retention of the intrinsic properties of the polyimide backbone chemistry and formation of metallurgical patterns in low TCE polyimide dielectric.

23 Claims, 3 Drawing Sheets

METHOD OF FORMING PATTERNED POLYIMIDE FILMS

BACKGROUND OF THE INVENTION

1. Field of the Invention

The present invention is generally related to to a method of producing patterned polyimide films using wet development of polyimide precursors through a photoresist mask. More particularly, the invention is concerned with the formation of low thermal coefficient of expansion (TCE) polyimide patterns starting with a polyamic acid precursor, typically, that derived from 3,3',4,4'-biphenyltetracarboxylic acid dianhydride-p-phenylenediamine (BPDA-PDA). The invention is further concerned with generating polyimide patterns with complete retention of the intrinsic properties of the polyimide backbone chemistry and formation of metallurgical patterns in low TCE polyimide dielectric.

2. Description of the Prior Art

High temperature stable polymers, particularly polyimides, are well-known in the microelectronics industry and have applications as insulators, interlevel dielectrics, and passivation layers for various types of metallurgy. Polyimides are preferred over inorganic insulators because they generally have a lower dielectric constant, are more amenable to film processing, and encompass a wide variety of chemistries that can be chosen to meet the functional requirements for different applications. However, a major drawback of conventional flexible chain polyimides, such as that derived from pyromellitic dianhydride-4,4'-oxydianiline (PMDA-ODA) polymer precursor which is formed by the condensation reaction of PMDA and ODA, is that they have a relatively high degree of in-plane thermal expansion. For example, the in-plane thermal expansion for PMDA-ODA polyimide is typically 33–35 ppm/degree at 100° C., which contrasts sharply with the typical thermal expansion of about 3 ppm/degree for inorganic substrates such as silicon, silicon oxide, silicon nitride, and other ceramics.

Differences in thermal expansion between a polyimide film and an underlying substrate can lead to thermal stress problems such as interfacial delamination upon high temperature processing. There have been recent developments in the field of low TCE polyimides which may address these thermal stress problems by providing polyimides with thermal expansion comparable to inorganic substrates. U.S. Pat. No. 4,690,999 discloses an example of uniaxially oriented low TCE polyimides and composite shaped articles.

Use of a polyimide insulator or interlevel dielectric requires a suitable method of forming polyimide patterns corresponding to desired metallurgical circuits. Prior methods for patterning polyimides have included photoprocessing and wet etch techniques.

Rubner et al., *Photographic Science and Engineering* (SPSE), Vol. 23, at pages 303–309 (1979) describe an approach which uses photoreactive polymer precursors. In this approach, generally negative working photosensitive polyamic acid salts or ester derivatives carrying photopolymerizable acrylate based crosslinking groups are used. These reactive precursors are directly patterned prior to imidization using conventional photolithographic techniques involving imagewise exposure through a mask and solvent development. After pattern formation, the films are baked or otherwise cured to form thermally stable polyimide patterns. Most of the commercial photosensitive polyimide compositions currently available are based on this approach and utilize a wide variety of photosensitizers and crosslinking additives; however, they are limited to flexible chain, relatively high TCE polyimide patterns.

It is generally recognized that the photoreactive polymer precursor approach results in inferior functional properties of the final cured film as compared to the corresponding polyimide films formed from non-photoreactive precursors. In the case of low TCE polyimides formed with photoreactive precursors, it has been observed that the fully cured polyimide has inferior mechanical, electrical, and thermomechanical properties relative to the polymer obtained using non-photosensitive precursors. Moreover, commercially available photosensitive precursors generally provide only negative tone patterns, and the formulations typically have poor shelf life and are prone to rapid gellation during storage. In addition, the photosensitive precursor formulations typically have accompanying lithographic control problems due to depth-of-focus limitations when patterning thick films. Furthermore, patterned films undergo up to 50% shrinkage upon curing which results in severe deformation of image profile and the extent of this problem is further related to the pattern density.

Generation of polyimide patterns by wet etching the non-photosensitive precursors represents an attractive alternative to incorporating photoreactive units in the polymer chain. According to this method, a polyamic acid film is formed on a substrate such as a silicon wafer, partially baked to remove solvent, then overcoated with a positive photoresist such as Shipley AZ 1350J, AZ 4210, or a negative resist such as Kodak KTFR. When using positive resists such as those based on a diazonaphthoquinone-novolac systems, the resist is imagewise exposed and developed with an aqueous base, such as potassium hydroxide (KOH) or tetramethylammoniumhydroxide (TMAH). The underlying polymer is patterned during the same step of developing the resist. The resist is then stripped with an organic solvent, and the patterned underlying film is subsequently baked or otherwise cured to form the cured polyimide patterns. This approach has been used to pattern conventional polyamic acids such as PMDA-ODA; however, problems arise from the isotropic etching inherent in the wet etching technique. Specifically, the prior art wet etch technique results in significant lateral etch, and this limits resolution, e.g., 25 µm wide features are formed in 10 µm thick films resulting in 6–7 µm thick polyimide film after full cure. Recently, efforts have been made to adjust the conventional wet etch process such that polyimides formed from flexible chain polyimide precursors have improved performance in terms of image profile and residue-free polyimide patterns.

U.S. Pat. No. 4,353,778 to Fineman et al. discloses a method of etching polyimide whereby a partially cured, approximately 16 µm thick PMDA-ODA polymer film on a silicon wafer or ceramic substrate is coated with 5 µm KTFR, a negative photoresist which is commercially available from Kodak, prebaked, imagewise exposed, and the resist layer is developed in organic solvent developer followed by a 130° C./15 min bake. The underlying exposed polymer film is etched in aqueous KOH at 50° C., baked again at 200° C., and etched a second time to clean out the erodable material from the pattern side walls. The photoresist is then stripped and the patterned film is thermally cured to complete imidization. When using a positive photoresist mask, a single etchant is used to pattern the resist and the polyimide. There is no information on the image resolution and the final thickness after the cure.

U.S. Pat. No. 4,411,735 to Belani discloses an etch process and compositions for a polymeric insulating layer of polyimide isoindoloquinazoline- dione. According to this method, a first level, partially cured polyimide layer is etched with aqueous aliphatic or aromatic amines or with an aqueous tetramethylammoniumhydroxide-n-methylpyrrolidone (TMAH-NMP) mixture using a negative photoresist mask pattern such as Waycoat IC resist (commercially available from Hunt Chemical Corp.), which itself is developed with an organic solvent such as xylene. The patterned stack is then subjected to a second partial cure at 200° C. to insolubilize the polyimide underlayer. The resist is then stripped with organic solvent and the patterned polyimide layer is subjected to a final thermal cure. Positive resists such as Shipley 1350J or AZ1470 and other etchants such as KOH, $NH_4OH$, NaOH, LiOH may also be utilized. After etching, $O_2$ plasma treatment is used for descumming or removal of residues. Image resolution is described as 3, 10 and 50 µm openings, but thickness is not given. Based on the viscosity given for the polyimide precursor and the spin speed, the final cured thickness may be only about 1–1.5 µm.

Low TCE polyimides, such as BPDA-PDA and related compounds, have a rigid-rod back-bone chemistry and are distinctly different from conventional, high TCE polyimides, such as PMDA-ODA, which are characterized by a high degree of chain flexibility. The inventors have found that the standard wet etch methods described above are not suitable for patterning low TCE polyimide precursors such as BPDA-PDA polyamic acid. Specifically, the conventional wet etch method cannot be used to achieve residue-free images in up to 10 µm thick fully cured films, they result in unsuitable resolution for highly integrated circuitry, and they cannot be used for relatively anisotropic etching or producing somewhat tapered wall profiles. This may be due to differences in the solubility characteristics of rigid-rod versus flexible chain polyimides, or there may be other structural factors responsible for the observed differences in the behavior of the polyamic acid precursors of these two categories of polyimides under wet etch conditions. Heretofore, there has been no wet etch process which is suitable for generating low TCE polyimide patterns.

SUMMARY OF THE INVENTION

It is therefore an object of the present invention to provide a wet etch process for low TCE polyimide pattern generation without changing the intrinsic properties of the polyimide backbone chemistry.

It is another object of the invention to provide a method for patterning BPDA-PDA and related rigid-rod, low TCE polyimide precursors without any loss of adhesion or delamination at any of the interfaces during the patterning process.

It is also an object of this invention to provide a method for patterning low TCE polyimide precursors using a resist mask to form high resolution, straight or tapered wall, image profiles of the polyimide patterns.

Another object of this invention is to form patterned low TCE polyimide films on silicon or ceramic substrates with no image deformation and low shrinkage from patterning through full cure.

A further object of this invention is to provide a method of forming either positive or negative tone patterns in low TCE polyimide.

Yet another object of this invention is to form metallurgical patterns in BPDA-PDA polyimide dielectric by first patterning polyimide precursors using a resist mask method, curing to form polyimide patterns, metallizing by sputtering, evaporation, or plate-up, and chemical-mechanical polishing to obtain a planarized structure.

According to this invention, high resolution, low TCE polyimide patterns are generated by first cleaning a silicon wafer or ceramic substrate and treating the surface with an adhesion promoter by spin coating. Polyamic acid precursors of a low TCE polyimide are then spin applied to the substrate and baked at about 100°–130° C. for fifteen to fifty minutes. The baking step partially removes the casting solvent from the polyamic acid film and is often called a soft-bake or a pre-bake. A photoresist, e.g., diazonaphthoquinone-novolak system, is spin applied over the polyamic acid precursor layer and baked at about 85°–90° C. for approximately two to fifteen minutes. The photoresist bake does not alter the structure of the polyamic acid precursors since the temperature used is below the pre-bake temperature. The resist is imaged and developed using aqueous potassium hydroxide developer to yield a resist pattern. During the resist imaging step, the potassium hydroxide developer does not significantly attack the underlying polyamic acid precursor layer. The resist pattern is then replicated into the underlying polyamic acid precursor layer as a latent image using a dilute solution of TMAH. The second development with TMAH physically changes the exposed polyamic acid precursor such that it can be easily removed via aqueous methanol or pure methanol spray with mechanical agitation. The two step developing results in minimal lateral etching and leaves the top resist in place. The resist is then removed by rinsing with acetone, which does not affect the patterned polyamic acid precursor layer, and the patterned structure is subsequently fully cured in accordance with a thermal cycle that fully converts the polyamic acid precursors to a permanent polyimide dielectric. Typically, the cure cycle will reach temperatures of 300° C. to 400° C. to completely cure the polyimide. Films of up to 20 µm may be patterned by varying the pre-bake temperatures and times. A metallized structure is then obtained by applying a thin conformal layer of chromium over the patterned polyimide layer followed by a copper layer. Chemical-mechanical polishing is used to obtain a planarized structure. A similar process may be used to form second level polyimide patterns over a first metallized layer having Cr/Cu/Cr metallurgical circuits with polyimide insulator on silicon or ceramic substrates.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

This invention provides a method of generating patterned low TCE polyimide films without any detrimental effect on the intrinsic properties of the polyimide backbone chemistry. In a preferred embodiment, polyamic acid precursors used in the patterning process are derived from the condensation reaction of 3,3',4,4'-biphenyltetracarboxylic acid dianhydride (BPDA) and p-phenylenediamine (PDA) in N-methylpyrrolidone (NMP), as is set forth in U.S. Pat. No. 5,115,090, which is herein incorporated by reference. The precursors are prepared in NMP as the solvent by using a stoichiometric offset such that for 100 mole parts of diamine, 98.0–99.5 mole parts, or more preferably, 97.5–98.7 mole parts, of the dianhydride are added to form the polyamic acid precursor and the residual amine end groups are capped with an aromatic anhydride. A preferred intrinsic viscosity range of the polyamic acid precursor is 1.05–1.55 dl/gram with a molecular weight of 25,000–35,000 grams/mole. Various compositions with this intrinsic viscosity which are useful for the purpose of this invention are prepared with a solids content range of 10.5–15.5%, and corresponding solution viscosity (kinematic) range being about 2,300–10,000 centistokes. The fully cured polyimide films formed with these compositions have the following mechanical properties: Elongation-at-Break, 43–50%; Elastic Modulus, 8.5–9.9 GPa; Ultimate Tensile Strength, 450–550 MPa for a polyimide thickness ranging from 5.5–12.5 µm; and a linear TCE of 5–6 ppm/°C. at 100° C. Higher viscosity compositions, for example, those with 31,500±3000 centistokes can also be used when a 12–15 µm fully cured film thickness is required with a single application.

Referring now to the drawings and, more particularly to FIGS. 1A–1D, a substrate 1, such as a silicon or ceramic substrate, is $O_2$ plasma cleaned and treated with an adhesion promoter (not shown). The adhesion promoter may be gamma-aminopropyl triethoxysilane -(A1100) as a 0.1% solution in water or in 95:5 ethanol-water mixture and may be applied by spin coating. A polyamic acid precursor 3, such as the BPDA-PDA polyamic acid composition described above, is then spin applied and infrared (IR) baked or oven baked at around 100°–130° C. for fifteen to fifty minutes depending on the thickness of the polyamic acid precursor layer 3. The object is to soft-bake or pre-bake the polyamic acid composition such that the casting solvent is substantially removed, which may be accompanied by some curing. The temperature of curing and duration can be varied (e.g., lower temperatures can be used for longer times and higher temperatures for shorter times). For BPDA-PDA precursor films on silicon wafers that are less than 5 µm thick, an approximately fifteen to thirty minute bake at about 110° C. is sufficient to achieve the desired results, and films that are between 8–15 µm thick require baking of approximately 30–50 minutes at about 110°–130° C. As pointed out above, curing is time and temperature dependent; therefore, this and other examples should merely be construed as indicative of typical time and temperature ranges.

Figure 1A:
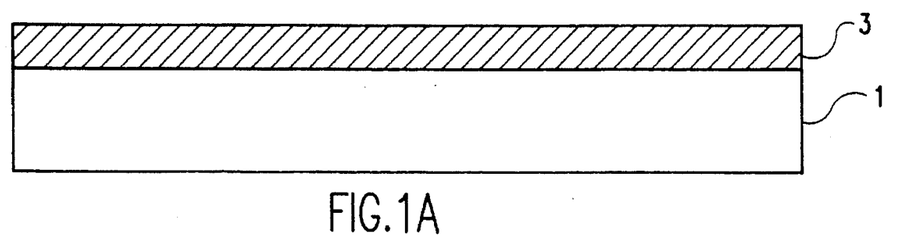
FIGS. 1A–1D are sequential cross-sectional side views of a substrate and a low TCE polyamic acid precursor layer, and illustrate a wet method for generating polyimide patterns.
Figure 1B:
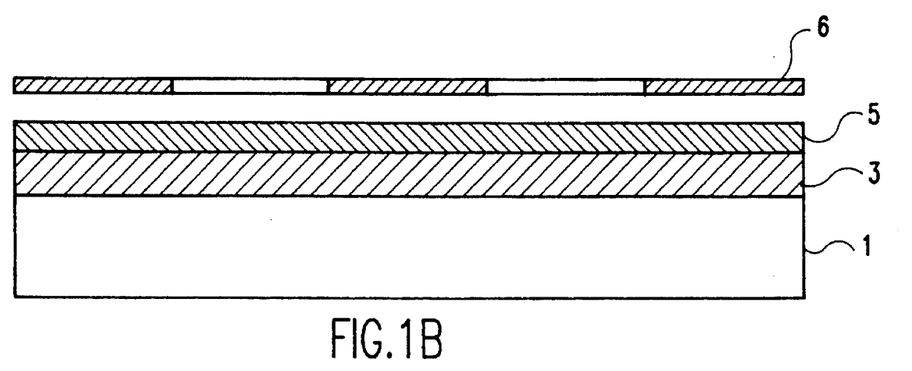

A positive photoresist 5, which is preferably TNS, a commercially available photoresist from Hoechst-Celanese Corporation based on diazonaphthoquinone-novolak chemistry, is then spin applied to the polyamic acid precursor layer 3. The photoresist 5 is then baked at 85° C. for fifteen minutes in an oven or at 90° C. for two to five minutes on a hotplate. Baking the photoresist 5 is performed at a milder temperature so as not to further cure the polyamic acid precursor composition 3. The photoresist 5 is imagewise exposed using exposure mask 6 and developed in a potassium hydroxide (KOH) developer, such as 1:4.5 AZ 2401, followed by a water rinse and nitrogen blow dry. The developer and its application procedures are chosen to fully remove photoresist mask material 5 to create a photoresist pattern 7, but to cause minimal impact on the underlying polyamic acid precursor layer 3.

Figure 1C:
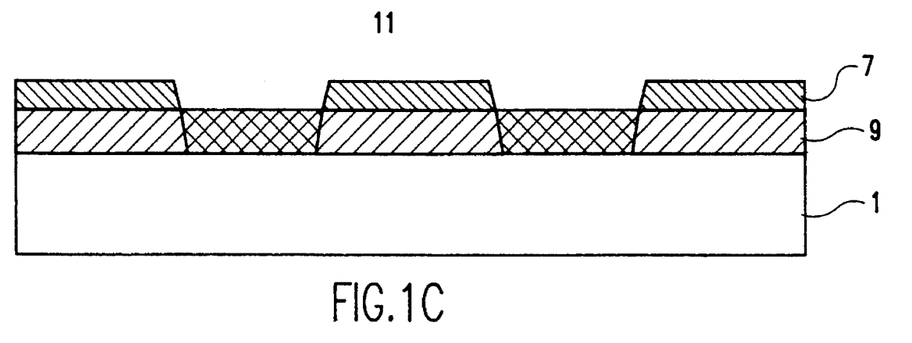

The resist pattern 7 is then replicated into the underlying polyamic acid precursor layer 3 as a latent image 11 by immersion in aqueous TMAH (0.05–0.25N) for approximately twenty to sixty seconds. The TMAH developing step does not attack the resist pattern 7; however, the exposed regions 9 of the polyamic acid precursor layer 3 are chemically changed from the nonexposed regions. Immediately subsequent to TMAH developing, a methanol or aqueous methanol rinse is performed with agitation or by a spray technique until the exposed regions 9 of polyamic acid precursor are completely removed. Alternatively, an ethanol, aqueous ethanol or aqueous propylene glycol rinse may be used. Typically, the removal procedure takes from about thirty to sixty seconds to leave the structure residue-free. As an optional step, the patterned film is treated with dilute acetic acid (to neutralize any basic sites on the pattern side walls) and thoroughly rinsed with deionized water. The resist pattern 7 is then removed by an acetone spray rinse and blow dry.

Figure 1D:
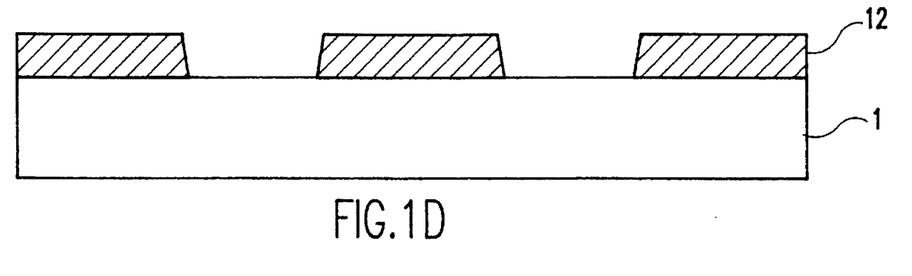

Finally, the resulting pattern 12 is cured according to a thermal cycle which will convert the patterned polyamic acid precursors to a fully cured polyimide pattern. For BPDA-PDA polyamic acid precursors like those described above, the thermal cycle may preferably be about 85° C. for approximately thirty minutes, about 140°–150° C. for approximately forty five minutes, about 230°–250° C. for approximately thirty minutes, about 300° C. for approximately thirty minutes, and about 350°–400° C. for approximately sixty minutes. With a BPDA-PDA system, the typical shrinkage observed from the patterning stage to the full cure stage is such that a 4.5–5 µm thick film after patterning gives about a 3.8–4 µm thick film after a full cure, and a 10–13.5 µm thick pattern is reduced to a 8.5–10.5 µm pattern with full cure to polyimide.

The above patterning method can be used for terminal via etching in semiconductor device structures or for metal circuits in polyimide dielectrics. To form a metallized structure, a thin conformal layer of chromium (Cr) is blanket deposited/sputtered over the patterned polyimide layer followed by a copper (Cu) seed layer followed by Cu plate-up or the entire Cu conductor layer is deposited by sputtering or evaporation corresponding to the pattern thickness. Subsequent chemical-mechanical polishing is used to obtain a planarized structure where the metallurgical pattern is embedded in and is co-planar with the polyimide dielectric.

The same process can be used to form second level polyimide patterns over a first metallized layer having Cr/Cu/Cr metallurgical circuits with polyimide insulator on silicon or ceramic substrates. If this process is to be used, prior to applying a second layer of polymer, the first structure is surface activated by oxygen reactive-ion-etching ($O_2$ RIE) for two to four minutes followed by the application of an adhesion promoter, such as A1100, as described above. This treatment is necessary for good adhesion between the two layers during the patterning process and in subsequent operations such as metallization and planarization steps to form multilayer interconnections. The polyamic acid precursor layer, such as the BPDA-PDA polyamic acid composition described above, is then applied and patterned according to the above method to create second level polyimide patterns.

The method of generating polyimide patterns according to this invention is not limited to BPDA-PDA (3,3',4,4'-biphenyltetracarboxylic dianhydride-p-phenylenediamine) and can be used to pattern other low TCE polyimides such as BPDA-benzidine (3,3',4,4'-biphenyltetracarboxylic dianhydride-benzidine), PMDA-PDA (pyromellitic dianhydride-p- phenylenediamine), PMDA-benzidine (pyromellitic dianhydride-benzidine), BTDA-PDA (3,3',4,4'-benzophenone tetracarboxylic acid dianhydride-p-phenylenediamine), or the like. In addition, the method can be used to pattern conventional polyimides such as PMDA-ODA, BPDA-ODA, BTDA-ODA, 6FDA-ODA, or the like. In both the low TCE type polyimides and the coventional polyimides, the wet method described above results in improved resolution, controlled image profiles, and minimal lateral etch. The choice of developers, including KOH and TMAH, is somewhat dependent on the photoresist and polyamic acid precursors chosen. Ideally, the photoresist developer should have minimal effect on the polyamic acid precursors and the polyamic acid precursor developer should have minimal effect on the photoresist. The process offers several advantages including low cost, process simplicity, and performance reliability. Because the polyimide backbone is unchanged using the wet etch process, the resulting polyimide is superior to that which can be achieved with photosensitive polyimides.

Experiments have shown that both positive and negative tone patterns can be formed in BPDA-PDA polyamic acid films of up to 10–11.5 μm thickness with a resolution of 16–20 μm line and space features which upon full cure provide 8–9 μm thick polyimide patterns with no problem of image distortion. With thinner films, even higher resolution features can be defined in the polyamic acid layer. According to this method, the typical pattern resolution achieved using a TNS resist mask is 6–12 μm lines and space features in 4 μm fully cured BPDA-PDA; 16–20 μm lines and space features and 15–20 μm vias in 8–10 μm fully cured BPDA-PDA with wall profiles ranging from 60°–75°. With films of less than 4 μm thickness, for example 1–3 μm, smaller features such as 2 μm lines and spaces can be resolved. For negative tone patterns, photosensitive polyimide such as DuPont's PD2700 series can be used as the resist mask. Such materials are imagewise exposed and developed in an organic solvent such as a γ-butyrolactone and xylene mixture. The resist pattern is then transferred to the underlying BPDA-PDA polyamic acid layer with aqueous TMAH followed by a methanol or aqueous methanol treatment. The photosensitive polyimide resist pattern may be removed if necessary, with organic solvent followed by a bake/cure to imidize the patterned polyamic acid layer. Subsequent metallization by sputtering, evaporation, or electroplating and chemical-mechanical polishing provides a planarized structure of metal circuitry in a low TCE polyimide dielectric.

FIGS. 2A–2I show another embodiment of this invention wherein a two resist application process using a two exposure mask technique provides further improvements in terms of resolution, image profile, and patterning of thicker films with less isotropic etching. As described above, a polyamic acid layer 23 such as BPDA-PDA is formed on a substrate 21, such as a silicon or ceramic substrate, which has previously been surface cleaned, as by $O_2$ plasma, and treated with an adhesion promoter. After a soft-bake of the polyamic acid layer 23 (e.g., for BPDA-PDA, 100°–130° C. for fifteen to fifty minutes, depending on the thickness of the film, is adequate), a positive photoresist 25, which is preferably TNS, is spin applied and baked at 85° C. for fifteen minutes in an oven or at 90° C. for two to five minutes on a hot plate. Baking is performed at a temperature which removes solvent from the photoresist 25, but does not cause any significant change in the polyamic acid precursor layer 23. The photoresist 25 is then imagewise exposed and developed in a KOH developer such as 1:4.5 AZ2401 followed by a water rinse and nitrogen blow dry to form openings 27 in resist pattern 35. As described above, the KOH developing process results in minimal attack on the underlying polyamic acid precurser layer 23.

Figure 2A:
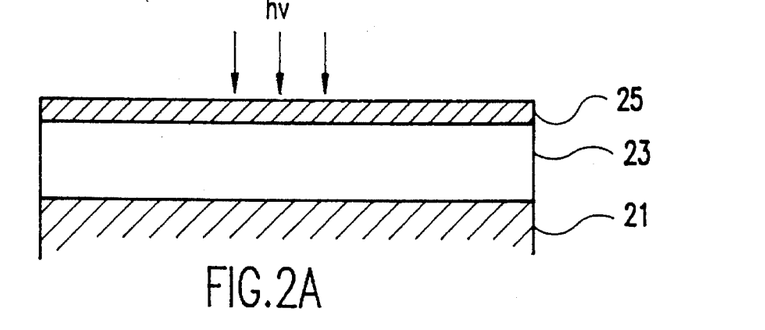
FIG. 2A–2I are sequential cross-sectional side views of a substrate and a low TCE polyamic acid precursor layer, and illustrate a method of generating a polyimide pattern using a two resist application process with a two mask set.
Figure 2B:
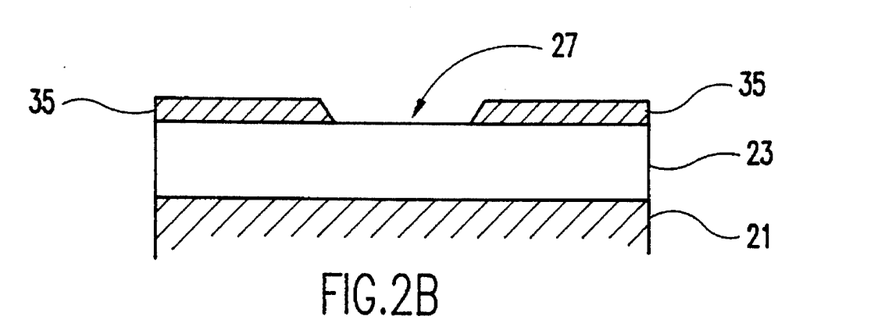
Figure 2C:
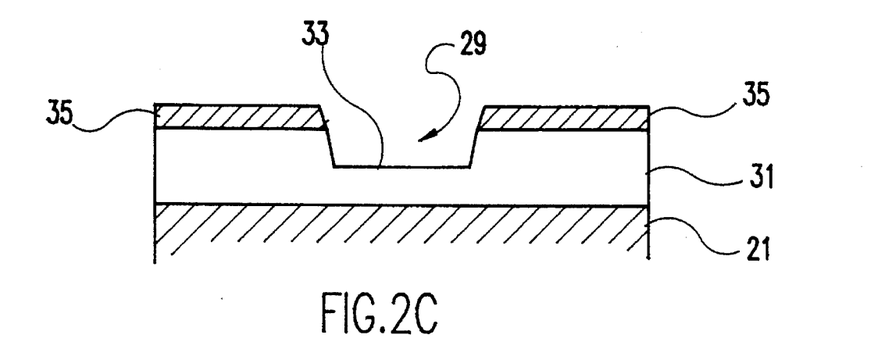
Figure 2D:
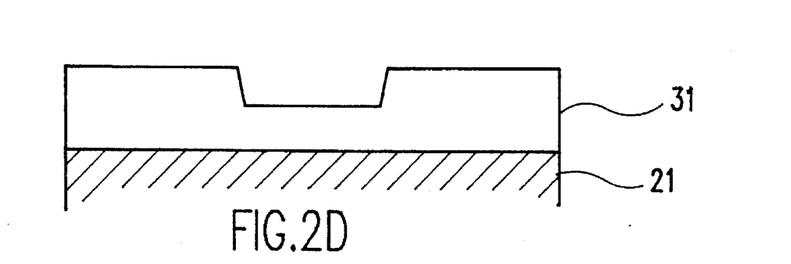

After KOH developing, the resist pattern 35 is replicated through a partial thickness 29 of the underlying polyamic acid precursor layer 23 by immersion in aqueous TMAH (0.06–0.20N). The duration of the immersion controls the amount of polyamic acid precursor 23 which becomes altered to a state where it can be removed using a methanol or aqueous methanol spray wash. The methanol wash is performed immediately after immersion and agitation or spray techniques are used to completely remove the polyamic acid precursor material down to trench 33 to yield a partially patterned polyamic acid film 31. As discussed above, the TMAH immersion has minimal effect on the resist pattern 35.

Figure 2E:
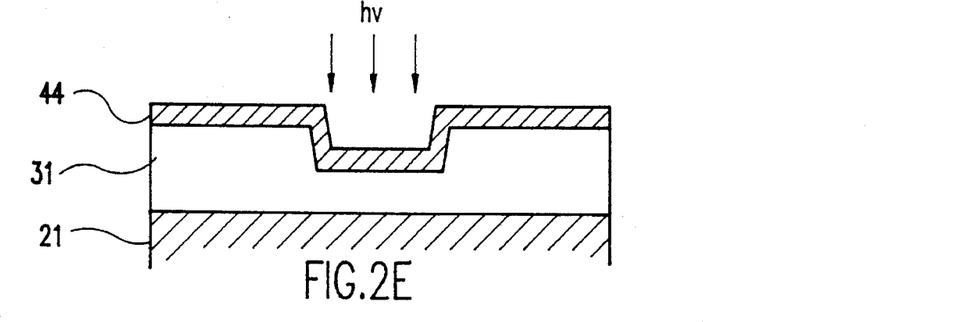
Figure 2F:
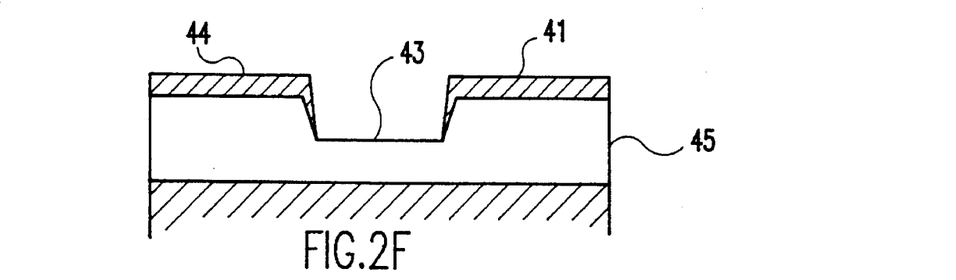
Figure 2G:
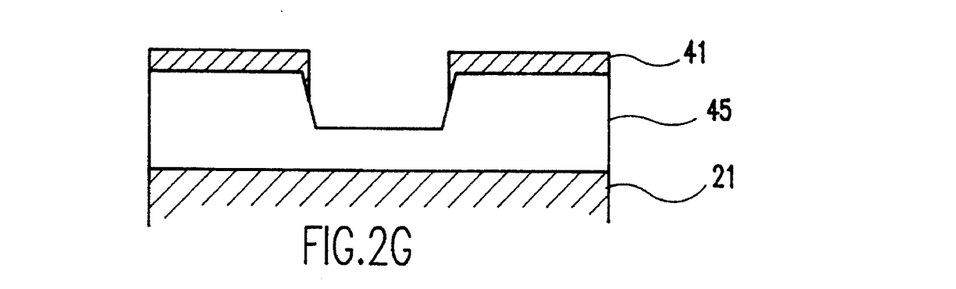

The resist pattern 35 is then removed by an acetone spray rinse and blown dry under nitrogen. The partially patterned polyamic acid film 31 is then baked at 75°–80° C. for about fifteen to thirty minutes to remove any trapped process solvents. Subsequently, a second positive resist 41 is applied over the partially patterned polyamic acid film 31. Application of the second positive resist 41 is preferably performed by a spray coating technique. The second positive resist 41 is then baked like the first photoresist 25 and imaged. However, the second positive resist 41 is preferably exposed using a second mask which has smaller openings than the first mask, whereby the image is aligned in the center of the trench 33 at region 43. In this way, photoresist 41 is left on top of the polyamic acid precursor layer 31 and down the side walls of the partially etched region. As before, the exposed resist at region 43 is removed by developing with an aqueous KOH developer.

Figure 2H:
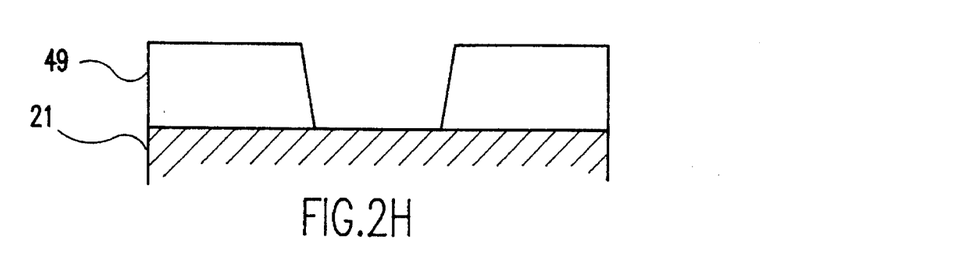
Figure 2I:
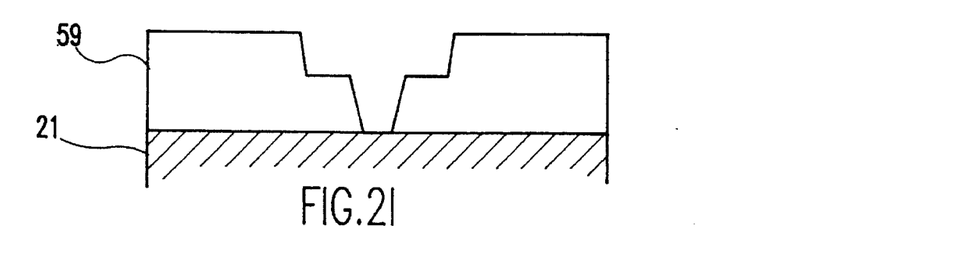

Subsequent to developing the photoresist 41, the pattern is transferred to the underlying polyamic acid portion 31 by immersion in TMAH followed by a methanol or aqueous methanol rinse with agitation or spray removal of the exposed polyamic acid portion to yield a partially patterned polyamic acid film 45. As shown in FIG. 2I, the two mask, two resist application process can also be used to form two different pattern profiles in the polyimide thickness. This is achieved by optimizing the imaging process in the second step while using a smaller mask, thus creating a structure 59. The photoresist 41 is then removed with acetone or an alternate solvent to yield a patterned polyamic acid layer 49 which is then fully cured to its polyimide form using a thermal cycle as described above. Metallized structures are created according to the discussion above. Advantages of the two step, two mask approach include being able to etch vias in thicker polyimides while retaining good image profile and high resolution, and also being able to create two different profile structures within a single thickness of the polyimide.

The following representative examples provide experimental details for generating polyimide patterns as illustrated in the Figures.

EXAMPLE 1

BPDA-PDA Polyimide Patterns on Silicon Wafers (a) Precleaned silicon wafers were plasma cleaned by subjecting them to $O_2$ plasma in a Tegal Asher at 500 watts for 10 minutes, cooled down to room temperature and then treated with 0.1% solution of A1100 adhesion promoter (gamma-aminopropyl-triethoxysilane) in 95:5 ethanol-water. BPDA-PDA polyamic acid solution in N-methylpyrrolidone (NMP) at 11.9% solids having a solution viscosity of 2750 centistokes and intrinsic viscosity 1.05–1.55 dl/gm, was then spin applied at 1400 rpm for 40 seconds and soft baked at 110° C. for 30 minutes in a nitrogen purged oven to obtain about 5.5 μm thick films (the BPDA-PDA polyamic acid was synthesized by condensation polymerization of 3,3',4,4'-biphenyl tetracarboxylic acid dianhydride (98.7 mole parts) and p-phenylene diamine (100 mole parts) in NMP according to the stoichiometry offset method described in U.S. Pat. No. 5,115,090, filed Mar. 27, 1990. The positive photoresist TNS (IBM resist commercially available from Hoechst-Celanese Corporation) which is based on a diazonaphthoquinone-novalak system, was spin applied at 3000 rpm for 30 seconds, prebaked in an oven at 85° C. for 15 minutes to form about a 1.1 μm thick film, and imagewise exposed through a contact mask with a 140 mJ/cm$^2$ dose at 365 nm on an Oriel exposure tool. The resist image was developed by immersion in aqueous KOH developer, 1:4.5 AZ2401, which is commercially available from Shipley Co., for 20 seconds followed by a thorough rinse in deionized water and a nitrogen blow dry. Resist image development under these conditions had no visible effect on the underlying polymer layer. The resist pattern was replicated in the exposed polyamic acid underlayer by immersion in 0.08N tetramethylammonium hydroxide (Microposit MF312 diluted 1:7 with deionized water) for 30 seconds, then in methanol with agitation for 40–60 seconds. This was followed by a 1–2 minute immersion in dilute acetic acid and a thorough rinse in deionized water. The resist layer was then removed by a spray rinse with acetone and a nitrogen blow dry. SEM micrographs of the polyamic acid patterns showed excellent quality residue-free images having clearly defined 8–12 μm lines and space features and via holes, with a wall angle of 70–75 degrees. The patterned polyamic acid layer was converted to polyimide by thermal curing in a programmed oven or furnace according to the following bake/cure cycle: 85° C./30 min, 150° C./30 min, 230° C./30 min, 300° C./30 min, and 380° C./60 min. Ramp rate between final temperatures was set at 2–5° C./min. SEM micrographs of the polyimide patterns showed no distortion or flow and no significant pattern density related differential in image bias. The final cured thickness obtained was about 3.6–3.8 μm having 8–12 μm image resolution.

Patterning Process for Thicker BPDA-PDA Films (b) Precleaned silicon wafers were plasma cleaned and surface modified with a 0.1% solution of A1100 adhesion promoter as described above in part (a). A first coat of the above-described BPDA-PDA polyamic acid solution was spin applied at 1500 rpm for 45 seconds and soft-baked at 110° C. for 30 minutes in a nitrogen purged oven and the coated wafers were allowed to cool down to room temperature. A second coat of the same BPDA-PDA solution was then applied as the first coat and baked at 110° C. for 45 minutes to obtain a soft-bake thickness of about 10 μm. About a 1.1 μm thick layer of the positive photoresist TNS (commercially available from Hoechst Celanese) was formed as described in (a) on the composite polyamic acid layer, and imagewise exposed at 140 mJ/cm$^2$ (365 nm) dose through a contact mask with an Oriel exposure tool. Resist image was developed by immersion in 1:4.5 AZ-2401 for 20 seconds followed by a thorough rinse in deionized water and a nitrogen blow dry. The resist pattern was replicated in the exposed underlayer by immersion in 0.1N TMAH (Microposit MF312, 0.57N, diluted with deionized water) for 45–50 seconds, followed by immersion with agitation in 50:50 methanol-water for 20 seconds and then 100% methanol for 40–50 seconds, a rinse in dilute acetic acid (optional), and, finally, resist removal with an acetone spray rinse and a nitrogen blow dry. SEM micrographs showed excellent quality residue-free features with dimensions of 12 μm, 16 μm, and 20 μm lines and spaces and via holes having a tapered wall profile (wall angle between 60–70 degrees). The patterned polyamic acid film was thermally cured according to the cure cycle given above in Example 1(a) which gave about a 7.0–7.5 μm thick fully cured polyimide.

Alternatively, instead of two coats of lower viscosity polyamic acid solution, thicker polyamic acid films were formed in a single coat by using a BPDA-PDA polyamic acid formulation having a solution viscosity of about 8500–9500 centistokes and about 14% solids, which was also synthesized by condensation polymerization of 3,3',4, 4'-biphenyl tetracarboxylic acid dianhydride (98.7 mole parts) and p-phenylene diamine (100 mole parts) in NMP according to the stoichiometry offset method described in U.S. Pat. No. 5,115,090. At a spin speed of 2000 rpm/40 seconds and soft-bake at 110–115° C./50 minutes in a convection oven, this polyamic acid composition provides about a 9–9.5 μm thick film. After the patterning process and the full cure to polyimide, the final thickness obtained was 6.8–7.2 μm.

EXAMPLE 2

BPDA-PDA Polyimide Patterns on a Ceramic Substrate and Formation of a Planarized Metallurgical Structure A polished and precleaned glass ceramic substrate was plasma cleaned by subjecting it to O$_2$ plasma in a Tegal Asher at 500 watts for 20 minutes (alternatively, surface cleaning was performed in an O$_2$ RIE tool), cooled down to room temperature, and then treated with a 0.1% solution of A1100 adhesion promoter as described in Example 1. A BPDA-PDA polyamic acid composition having a solution viscosity of 8590–9300 centistokes and 14.3% solids in NMP was then spin applied at 1800 rpm for 55 seconds and soft baked at 125° C. for 45 minutes in a nitrogen purged oven. A positive photoresist, TNS, was spin applied at 3000 rpm for 30 seconds, prebaked at 85° C. for 15 minutes, and imagewise exposed using 140 mJ/cm$^2$ at 365 nm through a contact mask with an Oriel exposure tool. A resist image was developed by immersion in 1:4.5 AZ-2401 for 20 seconds followed by a thorough rinse in deionized water and a nitrogen blow dry, followed by treatment with 1:4 diluted MF312 for 40 seconds, then 20 seconds in 50:50 methanol-water, followed by 60 seconds in 100% methanol with agitation. The resist was removed with an acetone spray rinse and blow dried with nitrogen. Microscopic examination of the patterned films showed clean images with no evidence of residue. Subsequent thermal curing in a programmed oven or furnace according to a bake/cure cycle of 85° C./45 min, 150° C./30 min, 230° C./30 min, 300° C. /30 min, and 380° C./60 min with the ramp rate between final temperatures being 2°–5° C./min, provided fully cured polyimide patterns.

Metallization of the patterned polyimide layer was carried out by blanket depositing Cr as an adhesion layer followed by Cu sputter deposition or evaporation, and chemical-mechanical polishing to remove overlying metal until the polyimide and the Cu metallurgical pattern was exposed and was co-planar with the BPDA-PDA polyimide insulator.

EXAMPLE 3

Second Level BPDA-PDA Polyimide Pattern Generation on a First Level Fully Cured Polyimide in Multilayer Metal Structure Fabrication A first level metal-polyimide structure on a ceramic substrate was surface activated by subjecting it to an $O_2$ Reactive-Ion-Etch (RIE) for 2–5 minutes at 200 watts, 50–100 mtorr $O_2$ pressure, 50 sccm gas flow, and treated with A1100 as an adhesion promoter (0.1% solution in water or in 95:5 ethanol-water) by spin application at 2000 rpm/60 seconds. A second layer of a BPDA-PDA polyamic acid composition as described in Examples 1 and 2 was applied and soft baked at 120° C./65 minutes in a nitrogen purged oven. TNS was spin applied at 3000 rpm for 30 seconds, prebaked at 85° C. for 15 minutes, and imagewise exposed using 140 mJ/cm$^2$ at 365 nm through a contact mask with an Oriel exposure tool. A resist image was developed by immersion in 1:4.5 AZ-2401 for 20 seconds followed by a thorough rinse in deionized water and a nitrogen blow dry, followed by pattern replication in the underlying polyamic acid layer by immersion in 1:5 diluted MF312 (Microposit 312 stock solution is aqueous TMAH, 0.57N) followed by methanol with agitation, and resist removal with an acetone spray rinse according to the method described in Examples 1 and 2. Microscopic examination of the patterned films showed clean images with no evidence of residue. Subsequent bake/cure to 350°–400° C. gave fully cured polyimide patterns. Metal patterns corresponding to the polyimide patterns were formed by blanket depositing Cr as an adhesion layer followed by Cu sputter deposition or evaporation, and chemical-mechanical polishing to remove overlying metal until the polyimide and the Cu metallurgical pattern was exposed and was co-planar with the BPDA-PDA polyimide insulator layer. Polyimide-to-polyimide interface adhesion was entirely maintained during the various operations including the polyamic acid patterning process and subsequent processing in forming the final planarized metallurgical structure.

EXAMPLE 4

BPDA-PDA Polyimide Terminal Via Pattern

Semiconductor silicon device wafers having a multilevel metal structure were coated with the BPDA-PDA polyamic acid solution described in Examples 1 and 2, to form about an 8.5–9.5 µm soft-baked film. This was overcoated with the TNS photoresist, prebaked at 85° C. for 15 minutes in an oven (or 5 minutes at 90° C. on a hot plate), exposed through a via mask on a Perkin-Elmer exposure tool, and developed with 1:4.5 AZ 2401 developer. The resist image was replicated in the underlying polyamic acid layer according to the process described in Example 1(b) (alternatively, spray development can also be used), treated with dilute acetic acid, and a thorough rinse with deionized water prior to resist removal with an acetone spray rinse. Subsequent bake/cure to 350°–400° C. in nitrogen or in forming gas (nitrogen+8–10% hydrogen) gave an excellent quality polyimide via pattern with a wall profile of 45–60 degrees in about 6.5 µm thick films.

EXAMPLE 5

Polyimide Patterning Process Using Negative Working Photosensitive Polyimide as a Resist Mask Soft-baked BPDA-PDA polyamic acid film was formed on silicon wafers as described in Examples 1 and 2, and overcoated with photosensitive polyimide PD2703 (commercially available from DuPont) which was soft baked at 65° C. for 30 minutes to form about a 2 µm thick layer. Imagewise exposure on a Perkin-Elmer exposure tool at 180 mJ/cm$^2$ followed by development in 50:50 gamma-butyrolactone:xylene for 2 minutes and a rinse in a 90:10 ratio of the same solvent mixture followed by a rinse in xylene alone, and a blow dry with nitrogen gave a negative tone resist pattern without affecting the underlying polymer layer. The subsequent process sequence involved immersion in TMAH, followed by methanol treatment with agitation to form polyamic acid patterns, and then bake/cure to 350°–400° C. to obtain fully cured polyimide patterns.

EXAMPLE 6

Polyimide Patterning Process Using Two Resist Applications and A Two Mask Set

Precleaned silicon wafers were plasma cleaned and surface modified with a 0.1% solution of A1100 adhesion promoter as described in Example 1. BPDA-PDA polyamic acid solution having a solution viscosity 8500–9500 centistokes (14% solids) was spin applied at 1500 rpm for 45 seconds and soft baked at 130° C. for 50 minutes in a nitrogen purged oven to obtain about a 14–15 µm soft-bake thickness. This was overcoated with a positive photoresist TNS to form about a 1.2 µm film which was imagewise exposed and developed in 1:4.5 AZ-2401 according to the process described in Example 1. The underlying polyamic acid was partially developed by sequential treatment with 1:10 diluted MF312 (Microposit MF312 is 0.57N aqueous TMAH) for 45 seconds, 50:50 methanol-water for 20 seconds and then 100% methanol for 40 seconds, and an acetone spray rinse to remove the resist layer. After drying at 75°–85° C. for 15 minutes, a TNS resist coating was applied again followed by the resist lithography using a smaller mask pattern than used for the first time. Resist pattern was replicated in the remaining thickness of the underlying polyamic acid layer by sequential treatment with 1:7 diluted MF312, methanol with agitation, dilute acetic acid, and a thorough rinse with deionized water, followed by an acetone spray rinse to remove the resist. The patterned polyamic acid film was thermally cured according to the cure cycle given above in Example 1 to obtain about 11–12 µm thick fully cured polyimide patterns having uniform pattern profile through the entire thickness or interrupted profile (see FIGS. 2A–I).

While the invention has been described in terms of several preferred embodiments which can be used singly or in combination, those skilled in the art will recognize that the invention can be practiced with modification within the spirit and scope of the appended claims.

Having thus described our invention, what we claim as new and desire to secure by Letters Patent is as follows:

1. A method of producing patterned low thermal coefficient of expansion polyimide films, comprising the steps of:

applying a polyamic acid precursor layer onto a substrate wherein said polyamic acid precursor in said layer is capable of imidizing to form a polyimide which has a thermal coefficient of expansion approximately equal to said substrate and is selected from the group consisting of 3,3',4,4'-biphenyltetracarboxylic dianhydride-p-phenylenediamine, 3,3,4,4'-biphenyltetracarboxylic dianhydride-benzidine, pyromellitic dianhydride-p-phenylenediamine, pyromellitic dianhydride-benzidine, and 3,3'4,4'-benzophenone tetracarboxylic acid dianhydride-p-phenylenediamine;

partially baking said polyamic acid precursor layer to a point where a significant amount of casting solvent in said polyamic acid precursor layer has been removed but wherein said polyamic acid precursor layer is still subject to development;

applying a positive photoresist on said polyamic acid precursor layer;

imagewise exposing said positive photoresist to radiation through a mask;

developing said positive photoresist with a first developer which is more active for said positive photoresist than for said polyamic acid precursor layer to yield a structure comprised of a patterned photoresist, a polyamic acid precursor layer and a substrate, said step of developing is performed under conditions where said polyamic acid precursor layer is not etched with said first developer, said first developer being an aqueous developer;

immersing said substrate in a second developer which is more active for said polyamic acid precursor layer than for said positive photoresist, said second developer being an aqueous developer;

removing polyamic acid precursor material exposed to said second developer to produce a patterned polyamic acid precursor layer; and curing said patterned polyamic acid precursor layer to yield a patterned polyimide which has a low thermal coefficient of expansion.

2. A method as recited in claim 1 wherein said first developer used in said developing step is potassium hydroxide.

3. A method as recited in claim 1 wherein said second developer used in said immersing step is tetramethylammoniumhydroxide.

4. A method as recited in claim 1 wherein said step of removing said polyamic precursor material exposed to said second developer includes spray treatment with a solvent.

5. A method as recited in claim 1 wherein said step of removing said polyamic precursor material exposed to said second developer includes mechanical agitation in a solvent.

6. A method as recited in claim 1 wherein said step of removing said polyamic acid precursor material exposed to said second developer is accomplished with a solvent selected from the group consisting of methanol, aqueous methanol, ethanol, aqueous ethanol and aqueous propylene glycol.

7. A method as recited in claim 1 wherein said step of curing is performed according to a prescribed time/temperature heating cycle.

8. A method as recited in claim 7 wherein said time/temperature heating cycle is about 85° C. for thirty minutes, between about 140°–150° C. for about forty five minutes, then about 230°–250° C. for thirty minutes, then about 300° C. for thirty minutes, and then about 350°–400° C. for sixty minutes.

9. A method as recited in claim 1 wherein said substrate includes a silicon device or a ceramic with a polyimide insulator layer having metal circuitry and said step of applying further comprises the steps of activating a surface of said substrate and treating said surface with an adhesion promoter prior to applying said polyamic acid precursor layer.

10. A method as recited in claim 1 further comprising the step of depositing metal in said patterned polyimide.

11. A method of generating polyimide patterns comprising the steps of:

applying a layer of a polyamic acid precursor of a thermally stable polyimide onto a substrate;

baking said polyamic acid precursor on said substrate at about 100°–130° C. for 15–65 minutes;

applying a layer of a positive photoresist onto said polyamic acid precursor;

forming a photoresist pattern and a polyimide pattern comprising the steps of imagewise exposing said positive photoresist to radiation, developing said positive photoresist in aqueous potassium hydroxide developer to generate exposed portions of said polyamic acid precursor under conditions where said polyamic acid precursor is not etched, treating said exposed portions with aqueous tetramethylammoniumhydroxide, rinsing with alcohol or aqueous alcohol to completely remove said exposed portions, and removing said positive photoresist with an organic solvent, and curing said polyamic acid precursor at temperatures up to 300°–400° C.

12. A method as recited in claim 11 wherein said substrate is selected to be any semiconductor device or metallized ceramic substrate, or ceramic substrate with a polyimide thin film structure having metallurgical circuits.

13. A method as recited in claim 11 wherein said step of forming a photoresist pattern includes after the step of rinsing with alcohol or aqueous alcohol to completely remove said exposed portions, the step of treating said exposed portions with a dilute solution of acetic acid followed by a water rinse.

14. A method as recited in claim 11, further comprising the step of deriving said polyamic acid precursor from flexible chain monomers.

15. A method of generating polyimide patterns, comprising the steps of:

applying a layer of a polyamic acid precursor of a thermally stable polyimide onto a substrate wherein said polyamic acid precursor is selected to have a low in-plane thermal coefficient of expansion in a range of 3–20 ppm/°C. at 100° C.;

baking said polyamic acid precursor on said substrate at about 100°–130° C. for 15–65 minutes;

applying a layer of a positive resist onto said polyamic acid precursor;

forming a photoresist pattern and a polyimide. pattern comprising the steps of imagewise exposing said positive photoresist to radiation, developing said positive photoresist in aqueous potassium hydroxide developer to generate exposed portions of said polyamic acid precursor under conditions where said polyamic acid precursor is not etched, treating said exposed portions with aqueous tetramethylammoniumhydroxide, rinsing with alcohol or aqueous alcohol to completely remove said exposed portions, and removing said positive photoresist with an organic solvent, and curing said polyamic acid precursor at temperatures up to 300°–400° C.

16. A method of generating polyimide patterns, comprising the steps of:

applying a layer of a polyamic acid precursor of a thermally stable polyimide onto a substrate wherein said polyamic acid precursor is selected to be a condensation polymer derived from 3,3',4,4'-biphenyltetracarboxylic aicd dianhydride-p-phenylenediamine and the corresponding polyimide derived therefrom having an in-plane thermal coefficient of expansion of 5–6 ppm/°C. at 100° C., elastic modulus of 8.7–9.8 GPa, elongation-at-break of 45–50%, and ultimate tensile strength of 450–550 MPa;

baking said polyamic acid precursor on said substrate at about 100°–130° C. for 15–65 minutes;

applying a layer of a positive resist onto said polyamic acid precursor;

forming a photoresist pattern and a polyimide pattern comprising the steps of imagewise exposing said positive photoresist to radiation, developing said positive photoresist in aqueous potassium hydroxide developer to generate exposed portions of said polyamic acid precursor under conditions where said polyamic acid precursor is not etched, treating said exposed portions with aqueous tetramethylammoniumhydroxide, rinsing with alcohol or aqueous alcohol to completely remove said exposed portions, and removing said positive photoresist with an organic solvent, and curing said polyamic acid precursor at temperatures up to 300°–400° C.

17. A method of generating polyimide patterns, comprising the steps of:

applying a layer of a polyamic acid precursor of a thermally stable polyimide onto a substrate wherein said polyamic acid precursor is selected to be a condensation polymer derived from a reaction of 3,3',4,4'-biphenyltetracarboxylic acid dianhydride and p-phenylenediamine in N-methylpyrrolidone and having an intrinsic viscosity of 1.05–1.55 dl/gram, molecular weight of 25,000–35,000, solution viscosity of 2300–10000 centistokes and solids content of 10.5–15.5%;

baking said polyamic acid precursor on said substrate at about 100°–130° C. for 15–65 minutes;

applying a layer of a positive resist onto said polyamic acid precursor;

forming a photoresist pattern and a polyimide pattern comprising the steps of imagewise exposing said positive photoresist to radiation, developing said positive photoresist in aqueous potassium hydroxide developer to generate exposed portions of said polyamic acid precursor under conditions where said polyamic acid precursor is not etched, treating said exposed portions with aqueous tetramethylammoniumhydroxide, rinsing with alcohol or aqueous alcohol to completely remove said exposed portions, and removing said positive photoresist with an organic solvent, and curing said polyamic acid precursor at temperatures up to 300°–400° C.

18. A method of patterning 3,3'4,4'-biphenyltetracarboxylic acid dianhydride-p-phenylenediamine polyamic acid precursor and forming metallurgical circuits therein comprising the steps of:

O$_2$ plasma cleaning a substrate comprised of a silicon wafer or ceramic substrate;

treating said substrate with gamma-aminopropyltriethoxysilane as an adhesion promoter used as a 0.1% solution in water or a 95% ethanol 5% water mixture;

applying a coating of a 3,3',4,4'-biphenyltetracarboxylic acid dianhydride-p-phenylenediamine polyamic acid composition to said substrate by spin or spray coating;

forming a patterned polyimide layer by baking said 3,3'4,4'-biphenyltetracarboxylic acid dianhydride-p-phenylenediamine polyamic acid composition at about 100°–130° C. for approximately 15–65 minutes, applying a positive photoresist, prebaking at about 85°–90° C. for approximately 2–15 minutes, imagewise exposing said positive photoresist using an optical exposure source, developing in a potassium hydroxide developer under conditions where said coating of said 3,3',4,4'-biphenyltetracarboxylic acid dianhydride-p-phenylenediamine polyamic acid composition is not etched, rinsing with water and blow drying, treating with aqueous tetramethylammoniumhydroxide, 0.05–0.25N, for 20–60 seconds without attack on said positive photoresist, rinsing with methanol or aqueous methanol with agitation or by spray technique until the exposed polyamic acid areas are completely removed, removing said positive photoresist by acetone spray rinse and blow drying, and thermally curing said 3,3',4,4'-biphenyltetracarboxylic acid dianhydride-p-phenylenediamine polyamic acid composition according to a thermal cycle comprising about 85° C. for approximately 30 minutes, about 140°–150° C. for approximately 45 minutes, about 230°–250° C. for approximately 30 minutes, about 300° C. for approximately 30 minutes, and about 350°–400° C. for approximately 60 minutes;

depositing a thin conformal layer of chromium by blanket sputtering over said patterned polyimide layer;

depositing a copper seed layer and copper plate-up or depositing an entire copper conductor layer by sputtering or evaporation corresponding to a thickness of said patterned polyimide layer; and chemical-mechanical polishing to obtain a planarized structure whereby a metallurgical pattern is embedded in and co-planar with said patterned polyimide layer.

19. The method of claim 18 wherein said 3,3',4,4'-biphenyltetracarboxylic acid dianhydride-p-phenylenediamine polyamic acid composition is baked at about 110° C. for approximately 15–30 minutes when said coating is less then 5 µm thick.

20. A method as recited in claim 18 wherein said 3,3',4,4'-biphenyltetracarboxylic acid dianhydride-p-phenylenediamine polyamic acid composition is baked at about 110°–130° C. for approximately 30–50 minutes when said coating is 8–15 µm thick.

21. A method as recited in claim 18 wherein after said 3,3',4,4'-biphenyltetracarboxylic acid dianhydride-p-phenylenediamine polyamic acid composition is baked and said positive photoresist is applied, said positive photoresist is prebaked in an oven at about 85° C. for approximately 15 minutes or on a hotplate at about 90° C. for approximately 2–5 minutes.

22. A method of forming a second level of polyimide patterns on a structure having a set of first metallized circuits with a polyimide insulator on silicon or ceramic substrate, comprising the steps of:

oxygen reactive ion etching said structure;

applying an adhesion promoter on said structure;

applying a 3,3',4,4'-biphenyltetracarboxylic acid dianhydride-p-phenylenediamine polyamic acid composition on said structure;

forming a patterned polyimide layer on said structure by baking said 3,3',4,4'-biphenyltetracarboxylic acid dianhydride-p-phenylene diamine polyamic acid composition on said structure;

forming a patterned polyimide layer on said structure by baking said 3,3',4,4'-biphenyltetracarboxylic acid dianhydride-p-phenylenediamine polyamic acid composition at about 100°–130° C. for approximately 15–65 minutes, applying a positive photoresist, prebaking at about 85°–90° C. for approximately 2–15 minutes, imagewise exposing said positive photoresist using an optical exposure source, developing in a potassium hydroxide developer under conditions where said 3,3'4,4'-biphenyltetracarboxylic acid dianhydride-p-phenylenediamine polyamic acid composition is not etched, rinsing with water and blow drying, treating with aqueous tetramethylammoniumhydroxide having a normality ranging from 0.04N to 0.25N for 20–60 seconds without attack on said positive photoresist, rinsing with methanol or aqueous methanol with agitation or by spray technique unil the exposed polyamic acid areas are completely removed, removing said photoresist by acetone spray rinse and blow drying, and thermally curing said 3,3',4,4'-biphenyltetracarboxylic acid dianhydride-p-phenylenediamine polyamic acid composition according to a thermal cycle comprising about 85° C. for approximately 30 minutes, about 140°–150° C. for approximately 45 minutes, about 230°–250° C. for approximately 30 minutes, about 300° C. for approximately 30 minutes, and about 350°–400° C. for approximately 60 minutes;

depositing a thin conformal layer of chromium by blanket sputtering over said patterned polyimide layer;

depositing a copper seed layer and copper plate-up or depositing an entier copper conductor layer by sputtering or evaporation corresponding to a thickness of said patterned polyimide layer; and chemical-mechanical polishing to obtain a planarized structure whereby a metallurgical pattern is embedded in and co-planar with said patterned polyimide layer.

23. A method of defining terminal vias in semiconductor devices using precursors of low thermal coefficient of expansion polyimides comprising the steps of:

$O_2$ plasma cleaning a substrate comprised of a silicon wafer or ceramic substrate;

treating said substrate with gamma-aminopropyl triethoxysilane as a 0.1% solution in water or 95:5 ethanol-water mixture as an adhesion promoter;

applying a coating of a 3,3',4,4'-biphenyltetracarboxylic acid dianhydride-p-phenylenediamine polyamic acid composition on said substrate by spin or spray coating; and forming a patterned polyimide layer on said structure by baking said 3,3',4,4'-biphenyltetracarboxylic acid dianhydride-p-phenylenediamine polyamic acid composition at about 100°–130° C. for approximately 15–65 minutes, applying a positive photoresist, prebaking at about 85°–90° C. for approximately 2–15 minutes, imagewise exposing said positive photoresist using an optical exposure source, developing in a potassium hydroxide developer under conditions where said coating of said 3,3',4,4'-biphenyltetracarboxylic acid dianhydride-p-phenylenediamine polyamic acid composition is not etched, rinsing with water and blow drying, treating with aqueous tetramethylammoniumhydroxide, 0.05–0.25N, for 20–60 seconds without attack on said positive photoresist, rinsing with methanol or aqueous methanol with agitation or by spray technique until the exposed polyamic acid areas are completely removed, removing said positive photoresist by acetone spray rinse and blow drying, and thermally curing said 3,3',4,4'-biphenyltetracarboxylic acid dianhydride-p-phenylenediamine polyamic acid composition according to a thermal cycle comprising about 85° C. for approximately 30 minutes, about 140°–150° C. for approximately 45 minutes, about 230°–250° C. for approximately 30 minutes, about 300° C. for approximately 30 minutes, and about 350°–400° C. for approximately 60 minutes.

* * * * *